(12) United States Patent
Han et al.

(10) Patent No.: US 7,939,223 B2
(45) Date of Patent: May 10, 2011

(54) PHOTOMASK USING SEPARATED EXPOSURE TECHNIQUE, METHOD OF FABRICATING PHOTOMASK, AND APPARATUS FOR FABRICATING PHOTOMASK BY USING THE METHOD

(75) Inventors: Hak-seung Han, Yongin-si (KR); Seong-woon Choi, Suwon-si (KR); Byung-gook Kim, Suwon-si (KR); Hee-bom Kim, Suwon-si (KR); Sung-ho Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 821 days.

(21) Appl. No.: 11/730,454

(22) Filed: Apr. 2, 2007

(65) Prior Publication Data

US 2007/0231715 A1    Oct. 4, 2007

(30) Foreign Application Priority Data

Apr. 4, 2006   (KR) ........................ 10-2006-0030588

(51) Int. Cl.
   *G03F 1/00*          (2006.01)
(52) U.S. Cl. ........................................... 430/5; 430/311
(58) Field of Classification Search .............. 430/5, 311, 430/394; 438/712; 216/2
   See application file for complete search history.

(56) References Cited

U.S. PATENT DOCUMENTS

| 5,935,734 | A * | 8/1999 | Pierrat ............................. 430/5 |
| 6,190,809 | B1 * | 2/2001 | Tzu et al. ......................... 430/5 |
| 6,333,213 | B2 * | 12/2001 | Hasebe et al. ................ 438/129 |
| 6,555,275 | B2 | 4/2003 | Yang |
| 6,605,411 | B2 | 8/2003 | Nakao |
| 7,083,338 | B2 | 8/2006 | Shin et al. |
| 2002/0009653 | A1 * | 1/2002 | Kawada et al. .................. 430/5 |
| 2004/0081896 | A1 * | 4/2004 | Pierrat ............................. 430/5 |
| 2005/0136338 | A1 * | 6/2005 | Chang ............................. 430/5 |

FOREIGN PATENT DOCUMENTS

| JP | 55-163841 | 12/1980 |
| JP | 11-061447 | 3/1999 |
| JP | 2001-188337 | 7/2001 |
| JP | 2002-075823 | 3/2002 |
| KR | 10-2002-0018280 | 3/2002 |
| KR | 10-2006-0012763 | 2/2006 |

* cited by examiner

*Primary Examiner* — Stephen Rosasco
*Assistant Examiner* — Rashid Alam
(74) *Attorney, Agent, or Firm* — Lee & Morse, P.C.

(57) ABSTRACT

A method of fabricating a photomask may include forming a light-shielding layer and a first resist film on a substrate, forming a first resist pattern by exposing first exposed regions of the first resist film to a first exposure source that may have a first energy, forming a first light shielding pattern by etching the selectively exposed light-shielding layer by using the first resist pattern as an etching mask, removing the first resist pattern, forming a second resist film on the first light-shielding layer, exposing second exposed regions of the second resist film that may have a desired pattern shape to a second exposure source that may have a second energy, forming a second light shielding pattern by etching the selectively exposed first light shielding pattern by using the second resist pattern as an etching mask, and removing the second resist pattern.

17 Claims, 10 Drawing Sheets

PHOTOMASK USING SEPARATED EXPOSURE TECHNIQUE, METHOD OF FABRICATING PHOTOMASK, AND APPARATUS FOR FABRICATING PHOTOMASK BY USING THE METHOD

BACKGROUND OF THE INVENTION

1. Field of the Invention

The present invention relates to a method and apparatus for fabricating a photomask. More particularly, the present invention relates to a method and apparatus for fabricating a photomask which may form a minute pattern by exposing the periphery of a boundary line between patterns to a high energy electron beam or light beam.

2. Description of the Related Art

High-performance semiconductor devices necessarily operate at high speed, process many signals, and have low power consumption and small size together with high integration. In order to operate one semiconductor chip at high speed, the power consumption of the semiconductor chip may preferably be low. In order to reduce the power consumption of the semiconductor chip, the size of each unit element one of the semiconductor chip may be reduced. Therefore, in order to achieve high-integration in semiconductor devices, unit elements may be minutely formed, which may largely depend on the capabilities of the patterning and photolithography techniques. The photolithography process, in turn, may depend on the quality of the photomask used in the process. A high-quality photomask may allow the photolithography process to be implemented at a higher level of performance, which may render it possible to obtain highly-integrated semiconductor devices. That is, the fabrication of a high-quality photomask having fine patterns may be important for manufacturing highly-integrated semiconductor elements.

SUMMARY OF THE INVENTION

It is therefore a feature of an embodiment of the present invention to provide a method and apparatus for fabricating a photomask which substantially overcome one or more of the problems due to the limitations and disadvantages of the related art.

It is therefore a feature of an embodiment of the present invention to provide a method and apparatus for fabricating a photomask which may reduce the adverse effects of a scattering phenomenon, may reduce the time required for exposure, and may form a desired minute pattern.

At least one of the above and other features and advantages of the present invention may be realized by providing a photomask fabricating method, which may include preparing a light-shielding layer and a resist film that may be formed on a substrate, forming a first resist pattern by exposing first exposed regions of the first resist film adjacent to patterns that may exist in a first pattern density region to a first exposure source that may have a first energy, so as to selectively expose the light-shielding layer, forming a first light shielding pattern by etching the selectively exposed light-shielding layer by utilizing the first resist pattern as an etching mask, removing the first resist pattern, forming a second resist film that may be on the first light-shielding layer, forming a second resist pattern by exposing second exposed regions of the second resist film, except for the first exposed regions of the first pattern region, and a second pattern region to a second exposure source that may have a second energy, forming a second light shielding pattern by etching the selectively exposed first light shielding pattern by utilizing the second resist pattern as a mask for etching, and removing the second resist pattern.

The first pattern region may have a pattern density lower than that of the second pattern region. In the first pattern region, a gap between the patterns may be equal to or more than about twice a line width of the pattern, and in the second pattern region, a gap between the patterns may be equal to or less than about twice a line width of the pattern. The first energy may be higher than the second energy. The first exposure source may be an electron beam, and the second exposure source may be an electron beam or light. The first energy may have an acceleration voltage higher than that of the second energy. The first energy may have an acceleration voltage of about 50 KeV, and the second energy has an acceleration voltage of about 10 KeV.

At least one of the above and other features and advantages of the present invention may be realized by providing a photomask fabricating method, which may include preparing a light-shielding layer and a resist film that may be formed on a substrate, exposing first exposed regions of the resist film that may be adjacent to patterns in a first pattern region to a first exposure source that may have a first energy, exposing second exposed regions of the resist film, except for the first exposed regions of the first pattern region, and a second pattern region to a second exposure source that may have a second energy, forming a resist pattern by developing the resist film to selectively expose the light-shielding layer, forming a light shielding pattern by etching the selectively exposed light-shielding layer by utilizing the resist pattern as a mask for etching, and removing the resist pattern.

At least one of the above and other features and advantages of the present invention may be realized by providing a photomask fabricating apparatus, which may include a vacuum chamber, a transfer chamber that may include a transfer arm, an arranging chamber for arranging the photomasks, a first exposure chamber for exposing first regions of surfaces of the photomasks to a first exposure source having a first energy, and a second exposure chamber for exposing the surfaces of the photomasks to a second exposure source having a second energy.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
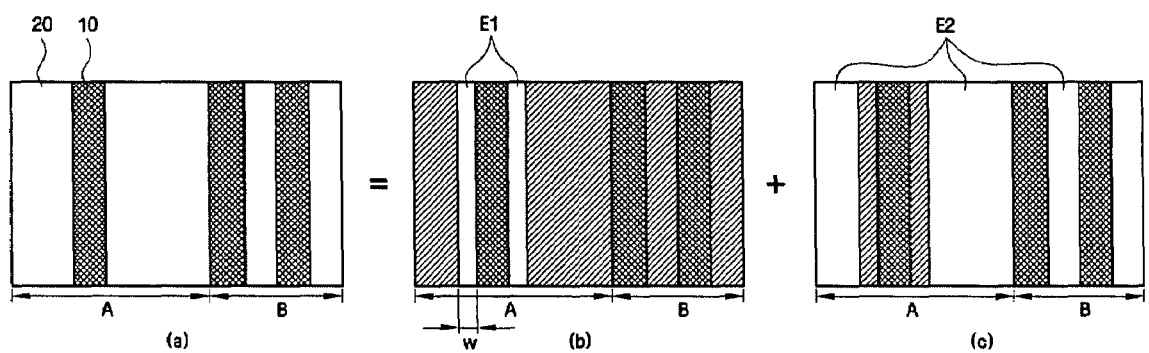
FIG. 1 illustrates an enlarged schematic plan view of a portion of a photomask for explaining stages in a method of fabricating a photomask according to an embodiment of the present invention.

Korean Patent Application No. 10-2006-0030588 filed on Apr. 4, 2006, in the Korean Intellectual Property Office, and entitled: "Photomask Using Separated Exposure Technique, Method of Fabricating Photomask, and Apparatus for Fabricating Photomask by Using the Method," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it may be directly on the other layer or substrate, or intervening layers may also be present. Further, it will be understood that when a layer is referred to as being "under" another layer, it may be directly under, and one or more intervening layers may also be present. In addition, it will also be understood that when a layer is referred to as being "between" two layers, it may be the only layer between the two layers, or one or more intervening layers may also be present. Like reference numerals refer to like elements throughout.

Embodiments of the invention are described herein with reference to cross-sectional illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Therefore, the regions illustrated in the drawing figures are schematic in nature and their shapes are not intended to illustrate the actual shape of a region of a device and are not intended to limit the scope of the invention.

In the following description, "exposure" means to irradiate electron beams or light onto a resist film formed on a photomask. Electron beams may not simultaneously be irradiated onto an entire surface of a photomask, but may be irradiated by an electron gun to be sequentially irradiated onto minute regions of a surface of a photomask. With electron beams, a shape of a pattern may be drawn or written on a photomask by electron beams, rather than using a photomask that may be exposed to electron beams. However, in order to separately explain the cases of using electron beams and using light, the description may appear complicated. For this reason, the same term will be used in both cases. "Exposing" thus means to irradiate electron beams or light onto a resist film.

In the following description, an exposure source may include sources for either an electron beam or light. In order to separately explain the cases of using electron beams and light, it may be necessary to repetitively exemplify the same or similar drawings and to repeat the description. Therefore, in order to avoid repeating the same description and to simply explain the technical idea of the present invention, inclusive terms will be used.

With an electron beam, three factors that may be considered include the size, the acceleration voltage, and the electron density of the electron beam. Therefore, a high energy electron beam may exist in various forms as compared to a low energy electron beam. More specifically, the total energy of an electron beam may become higher by raising the acceleration voltage and adjusting the electron density to be high or low, or by maintaining the electron density. In a high electron density state, the acceleration voltage may be high or low. Even when a large-spot electron beam having the same acceleration voltage and the same electron density is irradiated onto a wide region, the energy may increase. High energy may be understood to be high total energy. In embodiments of the present invention, an electron beam having a high acceleration voltage will be exemplified as a representative example.

With light, energy may increase by using light with a short wavelength or by increasing exposure time. In the present invention, light with a short wavelength will be exemplified.

A photomask used in the description may include a reticule, and the photomask may be used together with a reticule.

A region where patterns exist on a photomask may be divided into two regions. One of the divided regions may be a region where the pattern density is relatively low, and the other region may be a region where the pattern density is relatively high. Here, the pattern density represents a ratio of an area which the patterns occupy compared to the total area. For example, the pattern may be a portion onto which an electron beam or light is not irradiated.

The region having a low pattern density may represent a region where the gap between the patterns may be equal to or more than about twice the line width of the pattern. The region having a high pattern density may represent a region where the gap between the patterns is equal to or less than about twice the line width of the pattern. That is, the region having a high pattern density may be considered as a region where many patterns are aggregated densely like cell regions of a DRAM, and the region having a low pattern density may be considered to be a region where patterns are not densely aggregated.

Generally, a photomask may be patterned by being exposed to an electron beam or light. For example, a photomask may be completed by forming an impermeable film of chromium on a transparent glass substrate, forming a resist film that may react with an electron beam or light on the impermeable film, exposing a region of the resist film that may have a desired shape to an electron beam or light, forming a resist pattern by developing the resist film, etching the chromium film, and removing the resist pattern. In this case, the resist may be an electron beam (e-beam) resist or a photoresist.

An important process among the above-mentioned processes may be exposing the resist film to an electron beam or light, in particular, exposing the resist film to an electron beam. An electron beam may scatter because it has physical properties that are unlike light. Scattering is a phenomenon in which electrons irradiated onto an electron beam resist may not travel straight and may be scattered in irregular directions due to collisions with atoms of the electron beam resist or a patterned film. Scattering in an electron beam resist may be mainly divided into forward scattering and backward scattering. Scattering may show different aspects according to the acceleration voltage of an irradiated electron beam. Specifically, as the acceleration voltage becomes higher, the effect of the forward scattering may decrease and the effect of the backward scattering may increase. In contrast, as the acceleration voltage becomes lower, the effect of the forward scattering may increase and the effect of the backward scattering may decrease. Further, as the electron density of the electron beam becomes higher, the effect of the scattering may increase.

Therefore, it may be preferable to expose a photomask to an electron beam having an acceleration voltage and an electron density capable of minimizing the effect of the forward scattering and the backward scattering. However, since patterns to be formed on photomasks vary, the effect of scattering may vary according to the shapes and densities of the patterns. Specifically, in a high-density pattern, since the effect of scattered electrons at the time when adjacent patterns are exposed may be large, it may be preferable to radiate an electron beam having low energy, i.e., a low acceleration voltage and a low electron density, as compared to a low-density pattern. In the case of the low-density pattern, e.g., an isolated pattern, since the effect of scattered electrons is small, it may be preferable to radiate an electron beam having a relatively high acceleration voltage or electron density.

To form a minute pattern, when the entire photomask is exposed to electron beams having the same acceleration voltage, a region in which the size of a pattern may be excessively large may be generated, and even a region where a pattern is not formed may exist. For this reason, a method of adjusting an acceleration voltage according to the pattern density of each region may be used. For example, the entire pattern may be divided into a mesh form, the pattern density of each of the divided regions may be approximately calculated, and an acceleration voltage may be determined on the basis of the calculated pattern density. However, since the acceleration voltage is approximately calculated, it may be inaccurate. Further, since various results are obtained according to the pattern densities, acceleration voltages may vary. When exposure is performed using an electron beam with an acceleration voltage calculated in the above-mentioned manner, since an inaccurate acceleration voltage may be used, it may be difficult to form a desired pattern. Further, when various acceleration voltages are used, it may take several minutes or more to change the acceleration voltage. Therefore, it may take a significant amount of time to expose one photomask.

Hereafter, methods and apparatuses for fabricating a photomask according to embodiments of the present invention will be described with reference to the accompanying drawings.

FIG. 1 illustrates an enlarged schematic plan view of a portion of a photomask for explaining stages of a method of fabricating a photomask according to an embodiment of the present invention. FIG. 1 may be understood as illustrating a plan view of a complete photomask, a state in which a resist pattern is formed before completing a photomask, or a photomask pattern on computer data.

Referring to FIG. 1(a), dark patterns 10 and clear patterns 20 may be formed in a region A of a photomask surface having a low pattern density and a region B of the photomask surface having a high pattern density. The dark patterns 10 may be referred to as regions that are not exposed to an exposure source (an electron beam or light), and the clear patterns 20 may be referred to as regions exposed to the exposure source.

FIGS. 1(b) and 1(c) illustrate views showing representative examples of stages of a method of applying the photomask patterns of the present invention. In FIGS. 1(b) and 1(c), the clear patterns 20 in the region A having the low pattern density may be divided into two regions, that is, a first exposed region E1 and a second exposed region E2. The first and second exposed regions E1 and E2 may be separately exposed. The second exposed region E2 may be exposed together with the region B having the high pattern density. In this way, the photomask pattern shown in FIG. 1(a) may be completed. In FIGS. 1(a) to 1(c), hatched portions may represent regions that are not exposed. The first exposed region E1 may be exposed to an electron beam or light having higher energy than that of an electron beam or light to which the second exposed region E2 is exposed. In other words, the second exposed region E2 may be exposed to an electron beam or light having energy lower than that of the electron beam or light to which the first exposed region E1 is exposed. In contrast, the first exposed region E1 may be exposed to an electron beam or light having low energy, and the second exposed region E2 may be exposed to an electron beam or light having high energy. More specifically, the electron beam having the high energy may be understood as an electron beam having a high acceleration voltage, and the electron beam having the low energy may be understood as an electron beam having a low acceleration voltage. Further, light with a high energy may be understood as light with a short wavelength, and light with a low energy may be understood as light with a long wavelength.

Stages of a method of fabricating a photomask according to an embodiment of the present invention may use only exposure sources having two energy levels. The method of fabricating a photomask may reduce the exposure time of a photomask, as compared to a method of fabricating a photomask according to the related art which requires the utilization of exposure sources having various energy levels.

The first exposed region E1 in FIG. 1 is depicted to not invade the region of the dark pattern 10, for ease of explanation. However, in order to specifically carry out the present invention, the first exposed region E1 may be exposed to invade a predetermined region of the dark pattern 10. In contrast, the first exposed region E1 may be exposed to be separate from a boundary line between the dark pattern 10 and the clear pattern 20. That is, an unexposed region may exist in the clear region 20.

The width W of the first exposed region E1 will be described below in more detail.

When the first exposed region E1 is exposed to the exposure source having high energy and the second exposed region E2 is exposed to the exposure source having low energy, the second exposed region E2 may include the first exposed region E1. In other words, the first exposed region E1 may overlap the second exposed region E2. The configuration of FIG. 1 may thus be effective to form a photomask surface having various shapes and densities, and in particular, to form isolated patterns.

Figure 2:
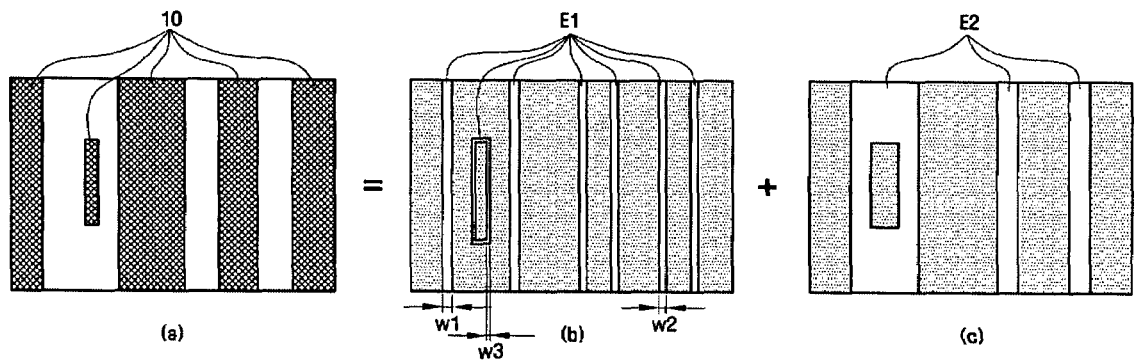
FIG. 2 illustrates an enlarged schematic plan view of a portion of a photomask for explaining stages of the method of fabricating a photomask according to the embodiment of the present invention in greater detail.

FIGS. 2(a) to 2(c) illustrate enlarged schematic plan views of a portion of a photomask for explaining stages in a method of fabricating a photomask according to the present invention in more detail.

Referring to FIG. 2(a) to 2(c), the first exposed regions E1 may be arranged to be adjacent to the dark patterns 10 and may be primarily exposed (see FIG. 2(b)). Then, the second exposed regions E2 that are not adjacent to the dark patterns 10 may be exposed (see FIG. 2(c)). In this way, a photomask having the dark patterns 10 with various sizes may be fabricated (see FIG. 2(a)). In particular, first exposed regions E1 with various widths W1, W2, and W3 may be formed. The widths W1, W2, and W3 of the first exposed regions E1 may depend on the size of the dark pattern 10 or the clear pattern 20. When a line-segment-shaped dark pattern is used, the first exposed region may not be arranged at any portion of the left side of FIG. 2(c). In the following description, the results obtained by carrying out experiments, that is, by completing photomasks by variously changing the widths W1, W2, and W3 of the first exposed regions E1 according to the size of the dark pattern 10 will be exemplified.

Figure 3A:
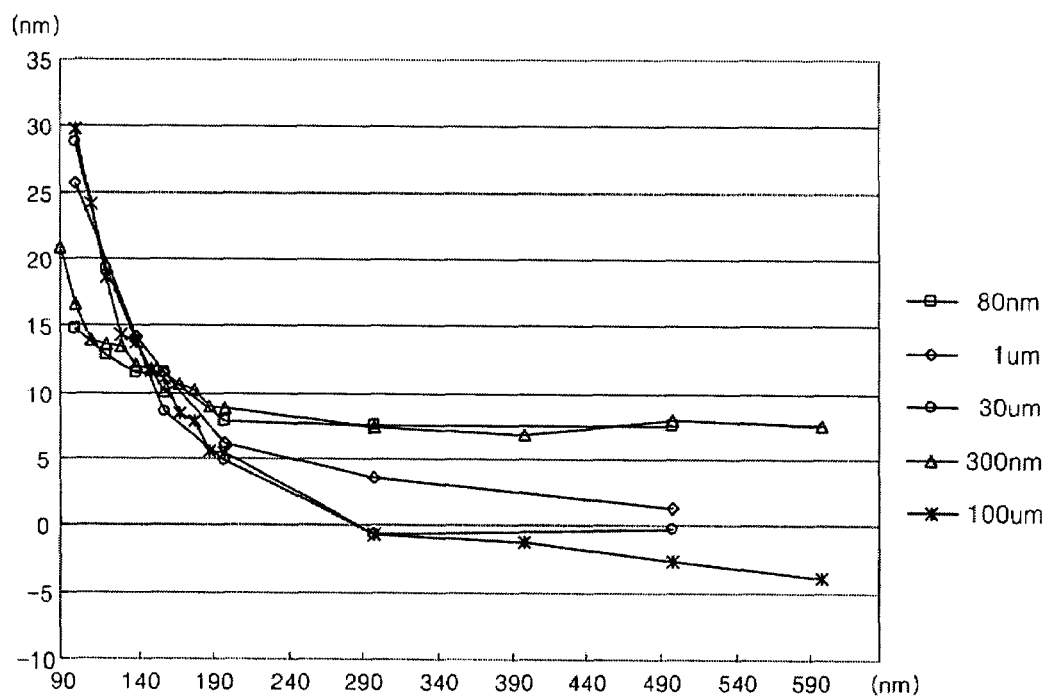
FIGS. 3A and 3B illustrate graphs of the completion results for photomasks fabricated by a method of fabricating a photomask according to an embodiment of the present invention.
Figure 3B:
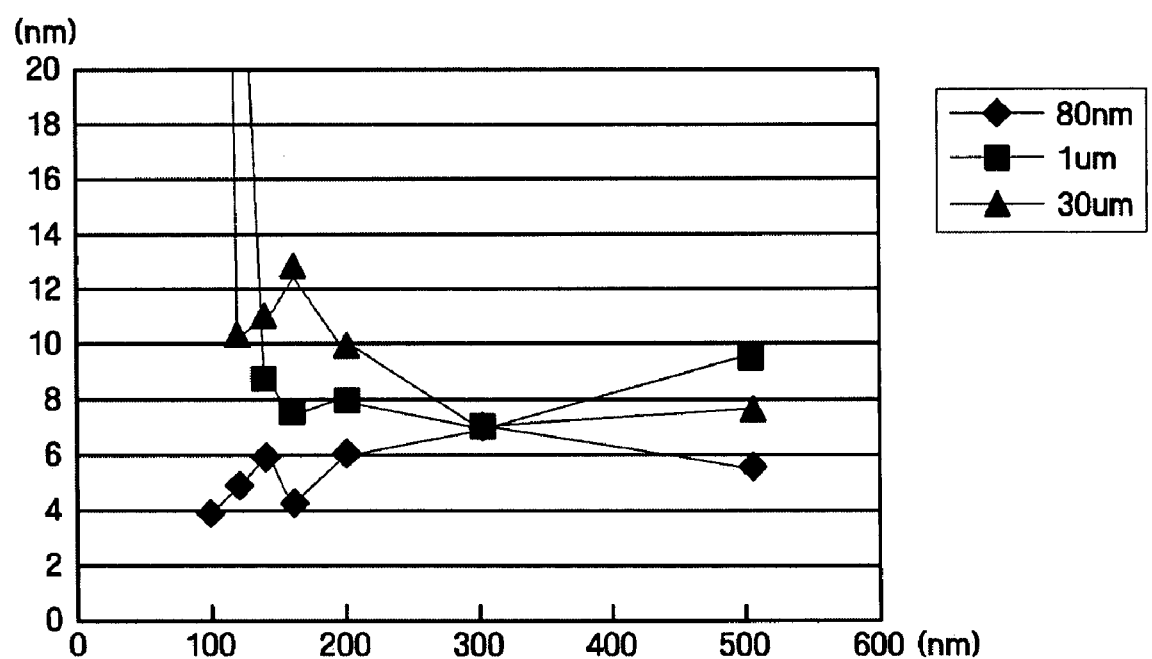

FIGS. 3A and 3B illustrate graphs of the results obtained by completing photomasks by the method of fabricating a photomask according to an embodiment of the present invention. More specifically, FIGS. 3A and 3B graph the experimental results obtained by measuring the line widths and edge roughness's of dark patterns of photomasks that are completed by variably splitting the widths of the first exposed regions. An electron beam having an acceleration voltage of about 50 keV may be used as the exposure source to which the first exposed regions are exposed, and an electron beam having an acceleration voltage of about 10 keV may be used as the exposure source to which the second exposed regions are exposed.

FIG. 3A shows the results obtained by measuring a variation in the line width of a dark pattern of each of the photomasks completed by setting the widths of the first exposed regions to about 80 nm, about 300 nm, about 1 μm, about 30 μm, and about 100 μm. The X-axis represents the line width of the dark pattern and the Y-axis represents linearity, that is, the difference between the measured line width and the designed line width. Both the line width and the linearity may be expressed as nm. It may be preferable to obtain higher linearity, that is, to obtain an experimental result approaching a horizontal line. In other words, setting the first exposed regions to about 80 nm and about 300 nm may represent preferable results as compared to the other cases, due to their high linearity. In particular, when the designed line width of the dark pattern is equal to or larger than about 200 nm, very stable linearity may be obtained.

FIG. 3B shows the results obtained by measuring the edge roughness of dark patterns of photomasks completed by setting the widths of the first exposed regions to about 80 nm, about 1 μm, and about 30 μm. The X-axis represents the line width of the dark pattern and the Y-axis represents the range of the variation in the line width. Both the line width and the range of the variation in the line width may be expressed as nm. More specifically, when the width of the first exposed region is set to about 80 nm, the edge roughness of the dark pattern may be very good. It may be seen that, when setting the widths of the dark patterns to about 1 μm and about 30 μm, and when the line width of the dark pattern is equal to or smaller than about 100 nm, the line width may vary remarkably. From the experimental results shown in FIGS. 3A and 3B, it may be seen that the most superior result may be obtained when the width of the first exposed region is set to about 80 nm.

However, the experimental results have been exemplified for presenting the technical concepts of the present invention under specific conditions. An optimized result may be obtained according to the energy of the exposure source through various experiments.

FIGS. 4A to 4H illustrate longitudinal sectional schematic views of stages of a method of fabricating a photomask according to an embodiment of the present invention.

Figure 4A:
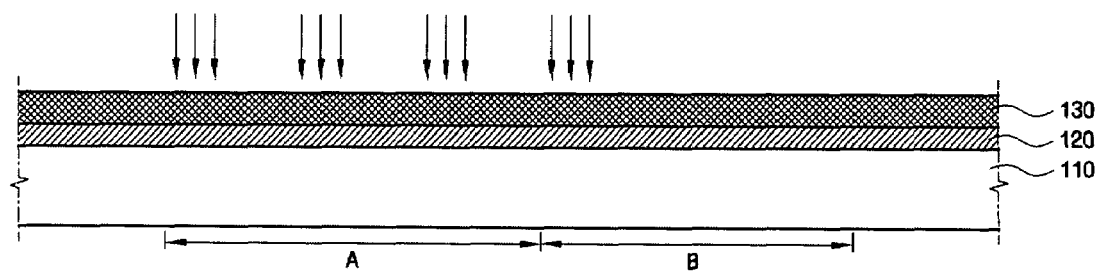
FIGS. 4A to 4H illustrate longitudinal sectional views of stages of a method of fabricating a photomask according to an embodiment of the present invention.

As shown in FIG. 4A, a light-shielding layer 120 may be formed on a substrate 110. A first resist film 130 may be formed on the light-shielding layer 120. Then, a first exposed region of a region A having a low pattern density of the first resist film 130 may be exposed to a first exposure source having a first energy level.

The substrate 110 may be made of, e.g., glass, quartz, silicon, etc.

The light-shielding layer 120 may be composed of, e.g., chromium, aluminum, titanium, molybdenum, ruthenium, or tantalum, a metal alloy, a metal compound incorporating oxygen or nitrogen, etc. The light-shielding layer 120 may preferably have excellent adhesive strength to the glass substrate 110, a thermal expansion coefficient that may be similar to that of the glass substrate 110, and flexibility. The light-shielding layer 120 may be made of at least one made of a metal material that may include, e.g., chromium, aluminum, titanium, molybdenum, ruthenium, or tantalum, a metal alloy, a metal compound incorporating oxygen or nitrogen, etc. Two or more layers of these materials may be used. Examples of the material forming the light-shielding layer 120 may also include compounds, e.g., chromium-aluminum alloy, metal oxide such as chromium oxide or aluminum oxide, metal nitride such as chromium nitride or aluminum nitride, metal oxynitride of all metallic elements, a compound incorporating an alloy, etc. For example, the light-shielding layer 120 having a thickness of about 2000 Å may be formed of chromium that has been deposited by sputtering. The about 2000 Å thickness of the light-shielding layer 120 is selected in order to illustrate the present invention, but is not limited thereto. With a photomask for forming a minute pattern, the light-shielding layer 120 may be formed with a thickness of several hundred Å, e.g., about 400 Å, about 500 Å, about 600 Å, etc.

Although not shown, an antireflection layer may be formed on the light-shielding layer 120. The antireflection layer may be a layer having reflectivity lower than that of the light-shielding layer 120. The antireflection layer may be formed of a material different from that of the light-shielding layer 120 and may be preferably formed of a material that may be patterned together with the light-shielding layer 120, in order to easily perform patterning. For example, when the light-shielding layer 120 is formed of chromium, the antireflection layer may be formed of chromium oxide. When the light-shielding layer 120 is formed of a metal alloy containing chromium or a metal compound other than pure chromium, the antireflection layer may be formed of a chromium oxide with a thickness of about several hundred Å. In this embodiment, although not described, the antireflection layer may be formed with a thickness of, e.g., about 500 Å.

The first resist film 130 may be formed of a material that may be selectively patterned by a developer after being exposed to an electron beam or light. In particular, the resist film 130 may be formed of, e.g., a carbon-based polymeric compound. The resist film 130 may be formed of a material that reacts relatively well with an electron beam, a material that reacts relatively well with light, or a material that reacts well with both the exposure sources.

In the present invention, only an electron beam, only light, or both the electron beam and light may be used as exposure sources. Therefore, limiting terms "electron beam resist" and "photoresist" are not used in this disclosure, but a comprehensive term "resist" is used. However, a specific resist may be used at the time when a photomask is formed in order to improve the properties of the photomask. The thickness of the first resist film 130 may be set to about 4000 Å in this embodiment of the present invention, but is not limited thereto.

The first exposed region may be a region substantially adjacent to a boundary line of a pattern in a region A in which the density of a pattern to be formed is low. More specifically, the first exposed region may be a region having a predetermined width from a boundary line of a dark pattern to be formed toward a clear pattern.

First energy refers to energy with a level different from the level of second energy. In this embodiment of the present invention, the first energy level may be set to be higher than the second energy level. However, the first energy level may be lower than the second energy level. When an electron beam is used, energy may be used together with a dose and, in particular, may be understood as being an acceleration voltage or an electron density. When light is used, energy may be used together with intensity, and in particular, may be understood as a wavelength or exposure time. In this embodiment of the present invention, electron beams having high energy, i.e., high acceleration voltages, may be applied. More specifically, an electron beam having an acceleration voltage of about 50 keV may be used as the first energy, and an electron beam having an acceleration voltage of about 10 keV may be used as the second energy. However, the acceleration voltages of the electron beams have been selected in order to exemplify the present invention, but are not limited thereto.

The first exposure source may correspond to a second exposure source, which will be described below. The first exposure source may be the same as the second exposure source. In this embodiment of the present invention, an electron beam may be used as the first exposure source. Light may also be used as the first exposure source.

Figure 4B:
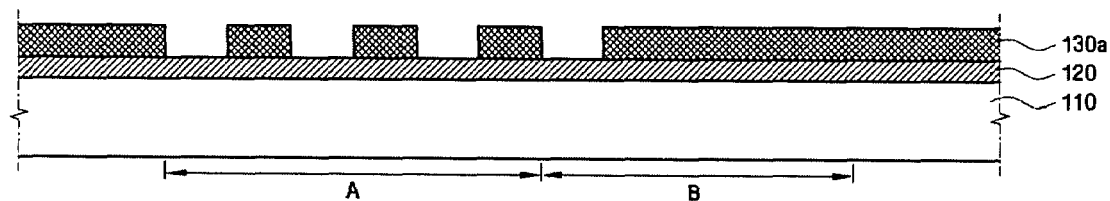
Figure 4C:
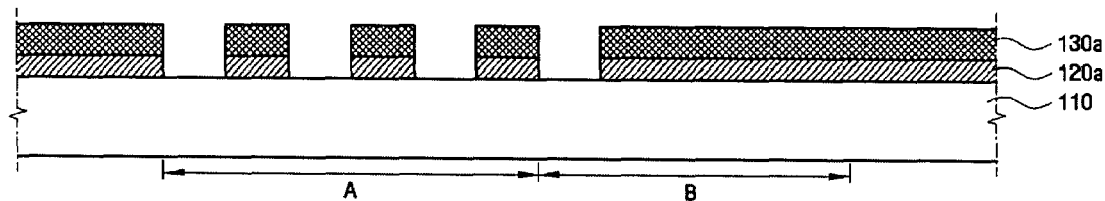

Referring to FIG. 4B, the first exposed region of the region A having a low pattern density of the first resist film 130 may be exposed to the first exposure source, and then the first resist film 130 may be developed by, e.g., a developer, thereby forming a first resist pattern 130*a*. The first resist pattern 130*a* may be formed by spraying or pouring a developer on the surface of the first resist film 130 or by soaking the first resist film 130 in the developer. When the first resist pattern 130*a* is formed, the light-shielding layer 120 under the first resist film 130 may be selectively exposed. The developing method is known and thus a detail description thereof will be omitted.

Referring to 4C, the exposed portions of the light-shielding layer 120 may be etched by using the first resist pattern 130*a* as an etching mask. As a result, a first light shielding pattern 120*a* may be formed such that the substrate 110 under the light-shielding layer 120 may be exposed. More specifically, the exposed portions of the light-shielding layer 120 may be etched by a wet etching method of, e.g., soaking the light-shielding layer in an acid etching agent or spraying an acid etching agent on the surface of the exposed portions of the light-shielding layer, or, e.g., a dry etching method using an etching gas combination that may include halogen, e.g., F—, Cl—, Br—, and I—. This etching step may form the first light shielding pattern 120*a* such that the substrate 110 under the light-shielding layer 120 may be selectively exposed. Examples of the acid etching agent may include, e.g., $H_2SO_4$, HF, $H_3PO_4$, HCl, etc. The etching gas combination may include gases including a halogenated gas, e.g., $CF_4$, $CHF_3$, $C_2F_4$, $C_3F_6$, $C_4F_8$, $SF_6$, $CCl_4$, HBr, etc. An inert gas may be used, e.g., Ne, Ar, and Xe, etc., and at least one of $O_2$ and $N_2$. The etching methods are well known in the art, and a detail description thereof will be omitted.

Figure 4D:
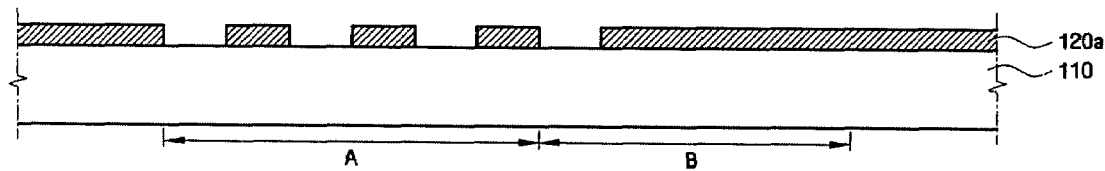

Referring to FIG. 4D, the first resist pattern 130*a* may be removed, and thus the first light shielding pattern 120*a* and the substrate 110 may be selectively exposed. More specifically, the first resist pattern 130*a* may be removed by a wet method using, e.g., a stripper containing $H_2SO_4$, or a dry method using, e.g., a gas combination containing $O_2$.

Figure 4E:
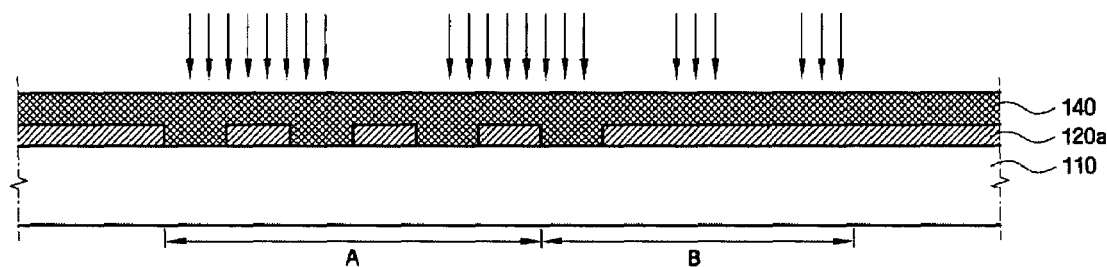

Referring to FIG. 4E, a second resist film 140 may be formed on the first light shielding pattern 120*a*, and the substrate 110 may be selectively exposed. Then, second exposed regions of the region A, having the low pattern density of the second resist film 140, and clear pattern regions of a region B, having a high pattern density of the second resist film 140, may be exposed to the second exposure source having the second energy. The second resist film 140 may be formed of the same material as the first resist film 130, or the second resist film 140 may be formed of a material different from that of the first resist film 130, according to the exposure source. The second resist film 140 may be formed of an organic polymeric material. The polymeric material may be, e.g., phenyl-formaldehyde resin, acrylic resin, methacrylic resin, etc.

The second exposed region may be separate from a boundary line of a pattern existing in the region A having the low pattern density. The second exposed region may partially overlap the first exposed region, but may not overlap the first exposed region, or may include the first exposed region.

The second energy may have an energy level different from the energy level of the first energy. In this embodiment of the present invention, the second energy may have an energy level lower than the level of the first energy.

The second exposure source may be the same as the first exposure source, or it may be different form the first exposure source. Both the first and second exposure sources may be electron beams or light beams. Alternatively, the first exposure source may be an electron beam and the second exposure source may be light, or the first exposure source may be light and the second exposure source may be an electron beam. When high energy light is used, ultraviolet light may be utilized.

Figure 4F:
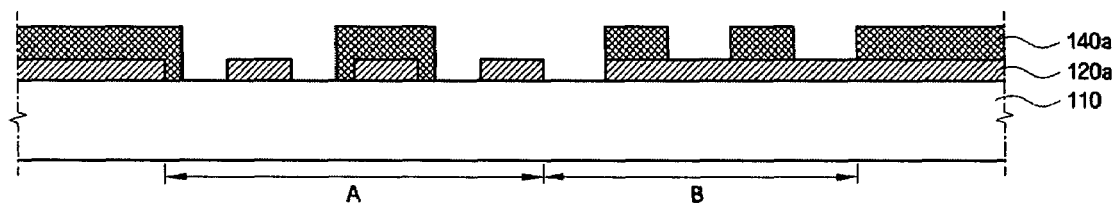

Referring to FIG. 4F, the second resist film 140 may be developed to thereby form a second resist pattern 140*a*. As a result, the first light shielding pattern 120*a* may be selectively exposed. The embodiment illustrated in FIG. 4F may be compared with the embodiment illustrated in FIG. 4B.

Figure 4G:
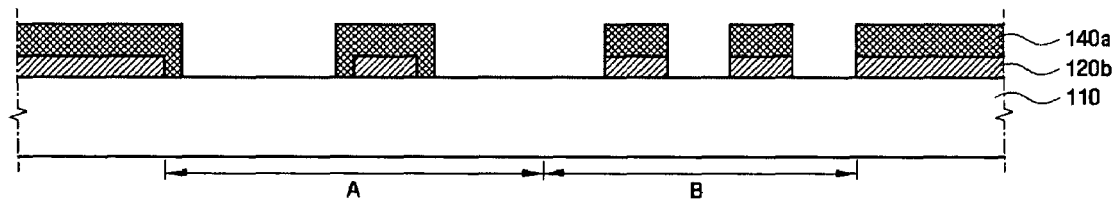

Referring to FIG. 4G, the first selectively exposed light shielding pattern 120*a* may be etched by using the second resist pattern 140*a* as a mask for etching, thereby forming a second light shielding pattern 120*b*. The second light shielding pattern 120 may be a final pattern to be formed. A detailed description of FIG. 4G may be compared with the embodiment illustrated in FIG. 4C and in the description of FIG. 4C.

Figure 4H:
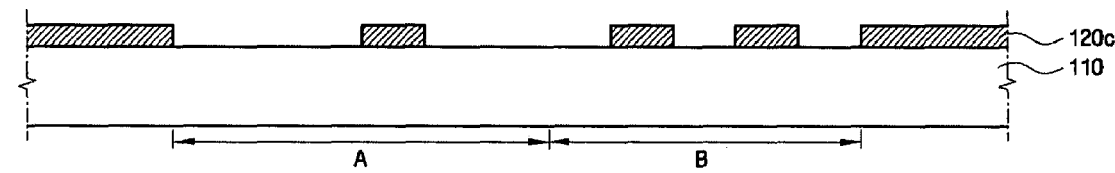

Referring to FIG. 4H, the second resist pattern 140*a* may be removed, thereby completing a photomask having the final pattern. The description of FIG. 4H may be compared with the embodiment illustrated in FIG. 4D and in the description of FIG. 4D.

Then, the photomask shown in FIG. 4H may go through a washing process, a correcting process, a pellicle attaching process, etc., to thereby complete a final photomask.

The method of fabricating a photomask according to the embodiment of the present invention described with reference to FIGS. 4A to 4H may include forming the first resist film 130, exposing the first exposed region of the first region A that may have the low pattern density of the first resist film 130 to the first exposure source that may have the first energy to form the first resist pattern 130*a*, patterning the light-shielding layer 120 to form the first light shielding pattern 120*a*, removing the first resist pattern 130*a*, and forming the second resist film 140. The method may further include exposing the second exposed region of the region A, that may have the low pattern density of the second resist film 140, and the clear pattern region of the region B, that may have the high pattern density of the second resist film 140, to the second exposure source that may have the second energy to form the second resist pattern 140*a*, patterning the first light shielding pattern 120*a* to form the second light shielding pattern 120*b*, and removing the second resist pattern 140*a*, thereby completing a final photomask. In the method, a process of forming, developing, and removing a resist film, an exposure process, and an etching process may be performed two or more times.

Next, a method of fabricating a photomask according to another embodiment of the present invention will be described with reference to FIGS. 5A to 5E.

FIGS. 5A to 5E illustrate longitudinal sectional schematic views of stages of a method of fabricating a photomask according to another embodiment of the present invention. The method may also be described in comparison to FIGS. 4A to 4H.

Figure 5A:
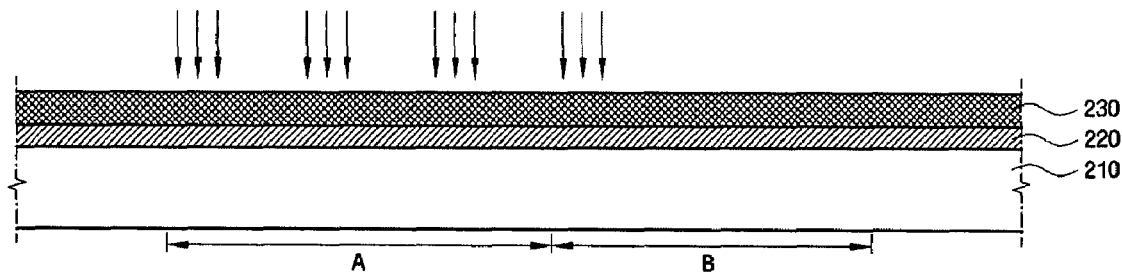
FIGS. 5A to 5E illustrate longitudinal sectional schematic views of stages of a method of fabricating a photomask according to another embodiment of the present invention.

As shown in FIG. 5A, a light-shielding layer 220 and a third resist film 230 may be sequentially formed on a photomask substrate 210, and then first exposed regions of a region A, having a low pattern density of the third resist film 230, may be exposed to a first exposure source having a first energy. This process may correspond to the process shown in FIG. 4A.

Figure 5B:
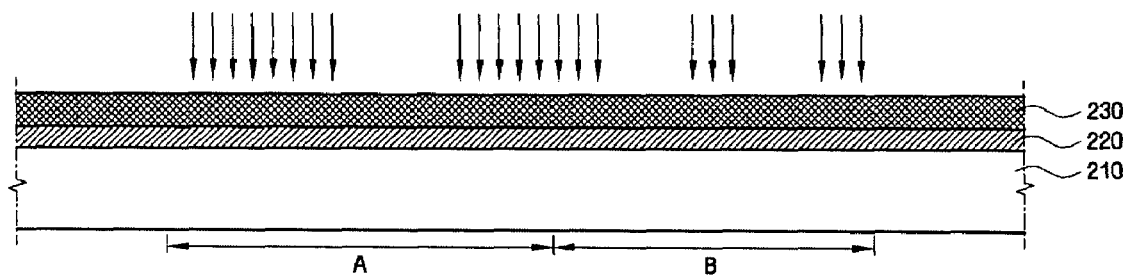

Referring to FIG. 5B, second exposed regions of the region A, having the low pattern density of the third resist film 230, and clear pattern regions of a region B having a high pattern density of the third resist film 230 may be exposed to a second exposure source having a second energy. This process may correspond to the process shown in FIG. 4E. More specifically, the same resist film may be exposed in FIGS. 5A and 5B.

Figure 5C:
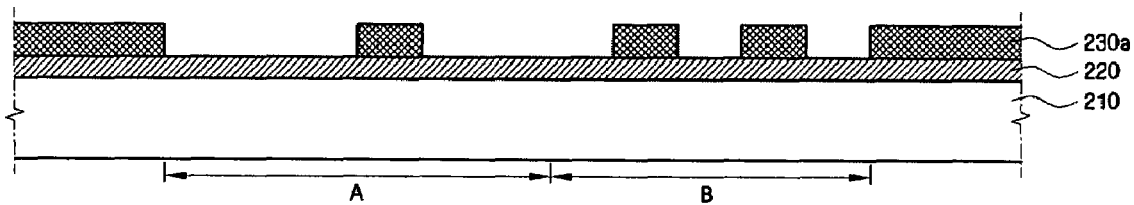

Referring to FIG. 5C, the third resist film 230 may be developed to form a third resist pattern 230a. As a result, the light-shielding layer 220 under the resist film 230 may be selectively exposed. The process may correspond to the processes shown in FIGS. 4B and 4F.

Figure 5D:
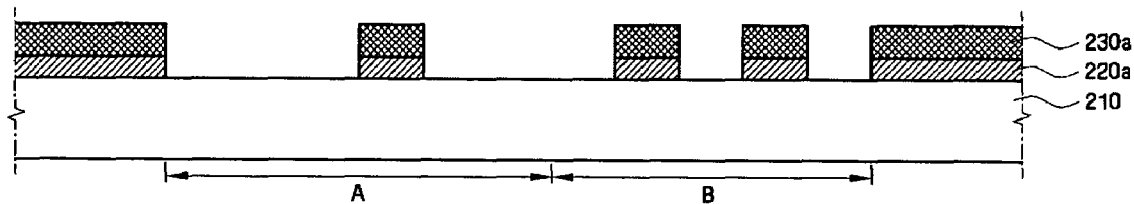

Referring to FIG. 5D, the exposed portions of the light-shielding layer 220 may be etched by using the third resist pattern 230a as a mask for etching, thereby forming a third light shielding pattern 220a. This process may correspond to the processes shown in FIGS. 4C and 4G.

Figure 5E:
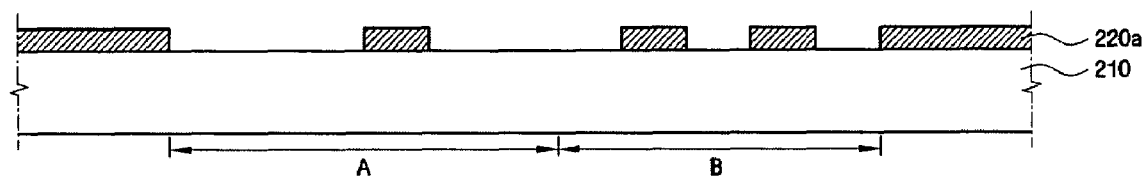

Referring to FIG. 5E, the third resist pattern 230a may be removed, thereby completing a photomask. This process may correspond to the processes shown in FIGS. 4D and 4H.

The method of fabricating a photomask according to another embodiment of the present invention described with reference to FIGS. 5A to 5E may include forming the light-shielding layer 220 and the resist film 230 on the photomask substrate 210, exposing the first exposed regions of the region A having the low pattern density of the resist film 230 to the first exposure source having the first energy, exposing the second exposed regions of the region A, which may have the low pattern density, and the clear pattern regions of the region B, which may have the high pattern density, to the second exposure source having the second energy to form the resist pattern 230a, patterning the light-shielding layer 220 to form the third light shielding pattern 220a, and removing the resist pattern 230a to complete the final photomask. The photomask fabricating method may use one resist film 230.

In the method of fabricating a photomask according to any one of the embodiments of the present invention, a photomask may be fabricated by forming a light-shielding layer and a first resist film on a substrate, performing a primary exposure of first exposed regions that may be adjacent to a pattern existing in a first pattern density region to an electron beam with a first energy, and performing a secondary exposure of exposing second exposed regions of the first pattern density region, except for the first exposed regions, and a second pattern density region to an electron beam with a second energy.

The first pattern density region may be a region having a pattern density lower than that of the second pattern density region. The electron beam with the first energy may have an electron acceleration voltage higher than that of the electron beam with the second energy.

Figure 6A:
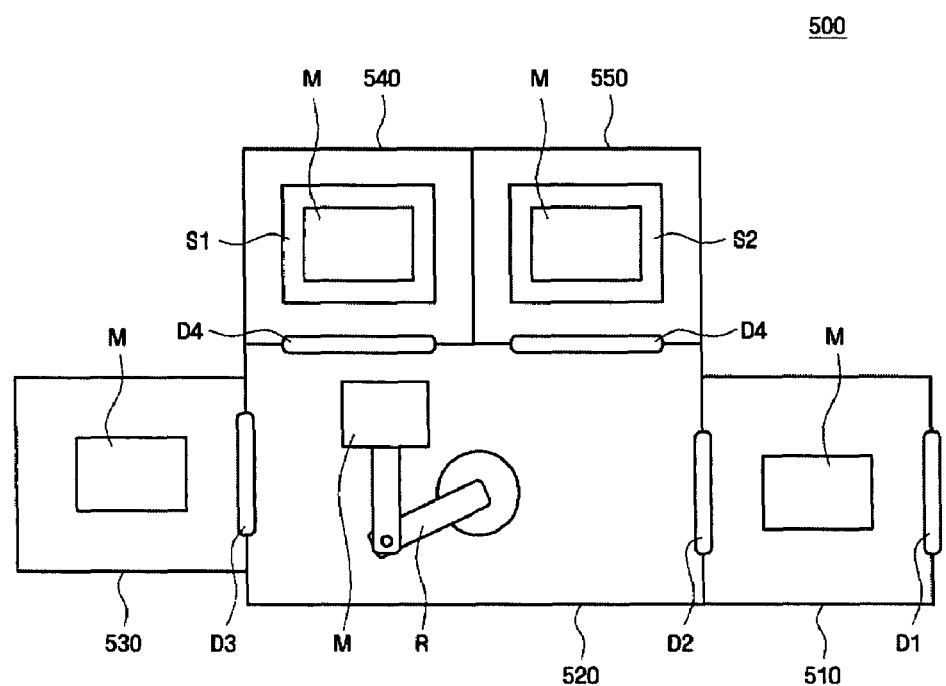
FIGS. 6A and 6B illustrate diagrams of an apparatus for fabricating a photomask according to an embodiment of the present invention.
Figure 6B:
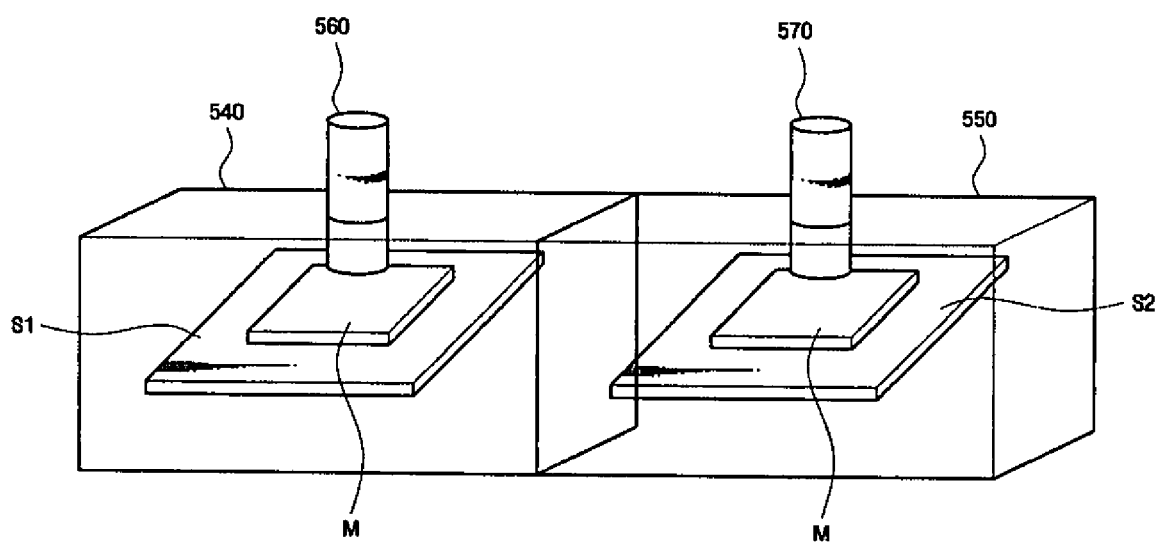

FIGS. 6A and 6B illustrate views of an apparatus for fabricating a photomask according to an embodiment of the present invention.

Referring to FIG. 6A, an apparatus 500 for fabricating a photomask according to an embodiment of the invention may include a vacuum chamber 510, a transfer chamber 520 that may include a transfer arm R capable of loading or unloading photomasks M, an arranging chamber 530 that may arrange the photomasks M, a first exposure chamber 540 that may expose the surfaces of blank photomasks to a first exposure source having a first energy, and a second exposure chamber 550 that may expose the surfaces of the blank photomasks to a second exposure source having a second energy.

The vacuum chamber 510 may be a device for placing the entire apparatus for fabricating a photomask under a vacuum, or the vacuum chamber 510 may be a space for making the air pressure in the chamber equal to the air pressure of the outside of the chamber when the photomask M may be carried into the chamber from the outside or is carried out of the chamber. Although not shown, a vacuum pump or a gas or air injection tube may be included in the vacuum chamber 510.

The transfer chamber 520 may include the transfer arm R. The transfer arm R may transfer the photomask M or a stage S among the vacuum chamber 510, the arranging chamber 530, the first exposure chamber 540, and the second exposure chamber 550. Entry to and egress from the various chambers may be via doors D1, D2, D3 and D4.

The arranging chamber 530 may arrange the photomasks M and, particularly, may arrange the photomasks M on the stage S. The stage S may be a device where photomasks are safely loaded in an exposing process.

The first exposure chamber 540 may be a chamber for primary exposure of the surface of a photomask to a first exposure source having a first energy, and the second exposure chamber 550 may be a chamber for secondary exposure of the surface of a photomask to a second exposure source having a second energy. The first and second exposure chambers will be described below in detail.

Both the first and second exposure sources may be electron beams, or the first exposure source may be an electron beam and the second exposure source may be light. Alternatively, the first exposure source may be light and the second exposure source may be an electron beam.

The first energy may be higher than the second energy, or the second energy may be higher than the first energy. When an exposure source is an electron beam, energy may be adjusted with an acceleration voltage or an electron density. When an exposure source is light, energy may be expressed by intensity, or it may be adjusted with the wavelength of light or exposure time. Adjusting the energy of an exposure source is well known, and thus a description thereof will be omitted.

A blank photomask refers to a photomask having no pattern formed therein. The blank photomask may include a glass substrate made of quartz, a light-shielding layer formed on the glass substrate, an antireflection layer formed on the light-shielding layer, and a resist film formed on the antireflection layer.

The light-shielding layer of the photomask may be formed of a metallic material, e.g., chromium, aluminum, molybdenum, or titanium, a metal alloy, a metal compound, a combination thereof, etc. The antireflection layer may be formed of a metal compound such as a chromium oxide.

The resist film may be formed of an electron beam resist or a photoresist.

FIG. 6B illustrates a perspective schematic view of the inside of the first and second exposure chambers 540 and 550.

Referring to FIG. 6B, the exposure chambers 540 and 550 may include separate exposure spaces, exposure stages S1 and S2, and exposure source irradiating devices 560 and 570, respectively. The stages S1 and S2, on which the photomasks M may be safely loaded, may move backward, forward, right, and left. The exposure source irradiating devices 560 and 570 may irradiate exposure sources onto the surfaces of the photomasks M safely loaded on the stages S1 and S2 while moving the stages S1 and S2 backward, forward, right, and left.

The exposure source irradiating devices 560 and 570 may irradiate an electron beam or light. When the exposure source is an electron beam, each of the exposure source irradiating devices 560 and 570 may irradiate an electron beam having a predetermined energy under the control of an electron beam calibration system. When the exposure source is light, it may be possible to irradiate light onto the photomasks M safely loaded on the stages S1 and S2 by transmitting the light from a light-emitting source through an optical fiber or a lens system. Although not shown, when the exposure source is light, a shutter or a separating system for separating light into multiple shots may be included in each exposure source irradiating device. More specifically, an openable separating system, such as a camera shutter, or a polygonal rotary mirror system may be provided. The rotary mirror system may separate light into multiple shots whose number may be the same as that of the planes thereof during one turn.

Figure 7A:
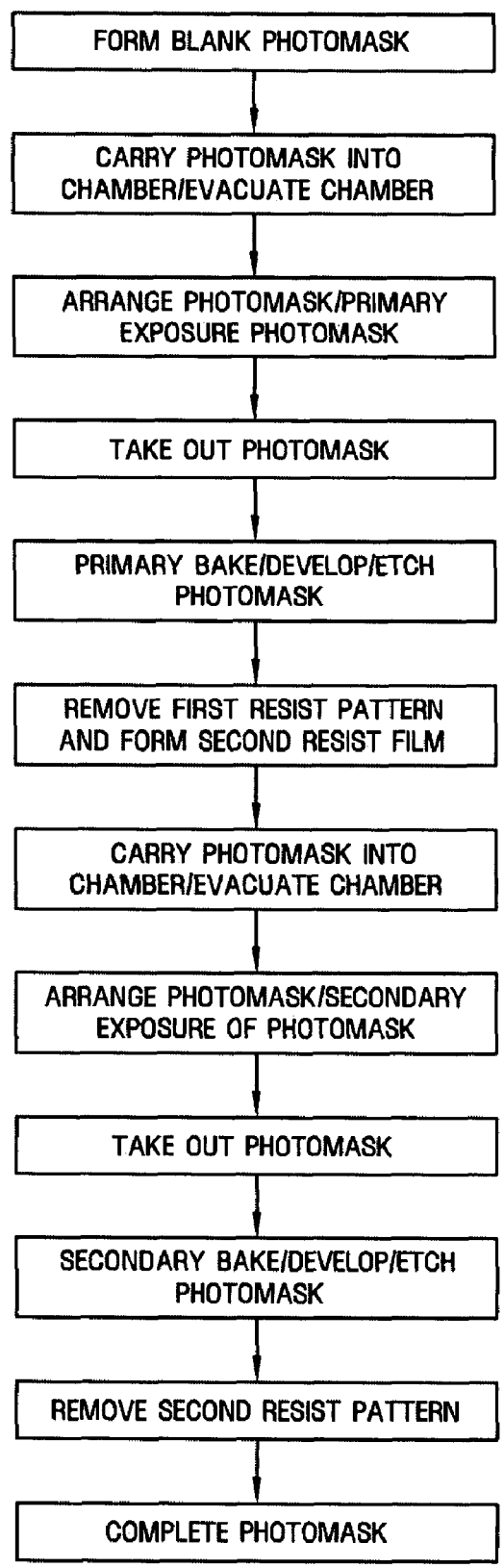
FIGS. 7A and 7B illustrate flow charts showing stages of a method of fabricating a photomask by using an apparatus for fabricating a photomask according to an embodiment of the present invention.
Figure 7B:
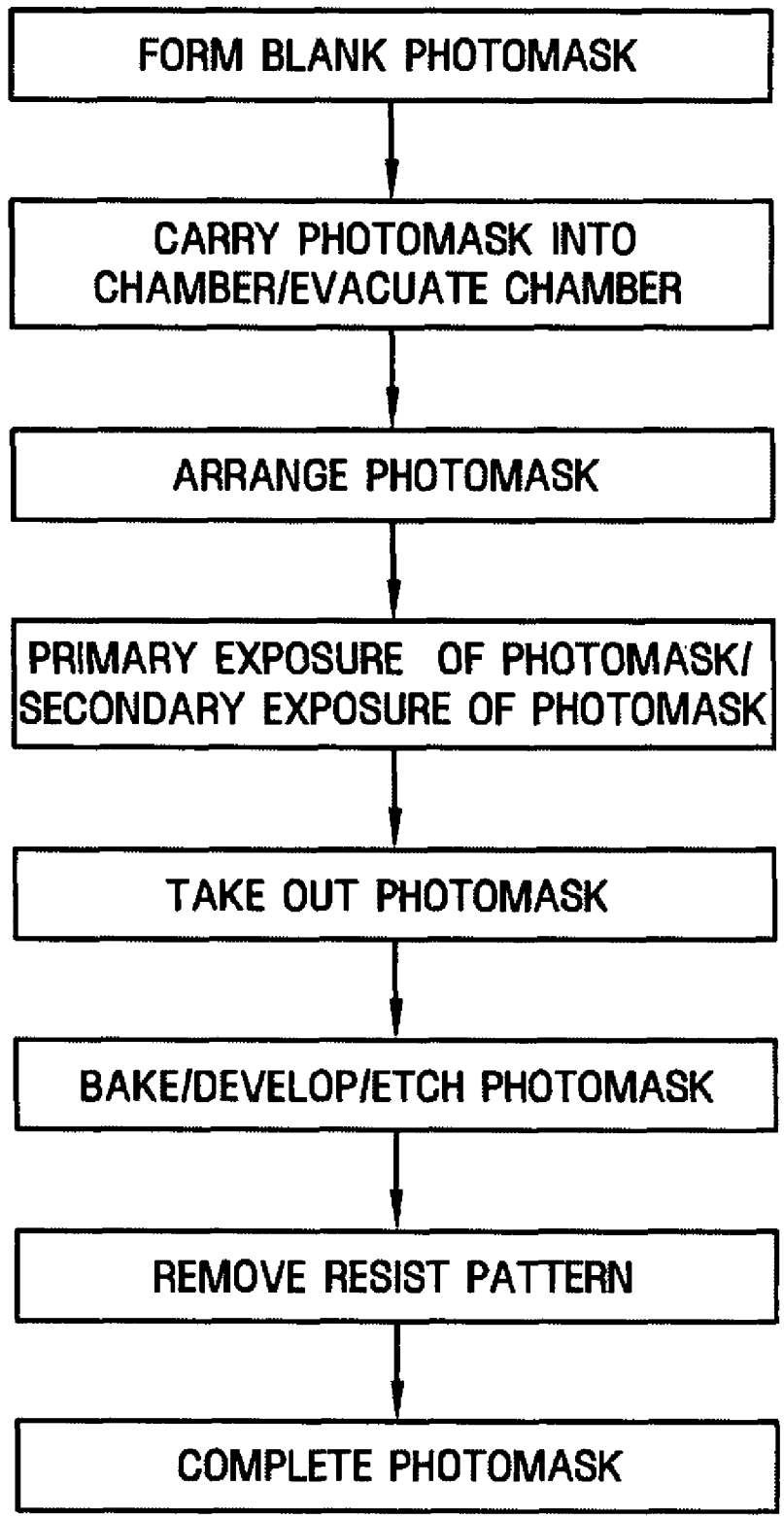

FIGS. 7A and 7B are flow charts illustrating stages of a method of fabricating a photomask by using an apparatus for fabricating a photomask according to an embodiment of the present invention. The method of fabricating a photomask using the apparatus for fabricating a photomask according to an embodiment of the present invention will be described with reference to FIG. 7A.

First, a light-shielding layer including an antireflection layer may be formed on a substrate, and a first resist film may be formed on the light-shielding layer, thereby completing a blank photomask. The blank photomask may be carried into the vacuum chamber 510 of the apparatus for fabricating a photomask, and the vacuum chamber 510 may be placed under a vacuum. Then, a door D2 between the vacuum chamber 510 and the transfer chamber 520 may be opened. Subsequently, the transfer arm R may transfer the photomask M from the vacuum chamber 510 to the arranging chamber 530, may arrange the photomask M on the stage S in the arranging chamber 530, and may transfer the arranged photomask M to the first exposure chamber 540. In the first exposure chamber 540, the first exposed regions of the photomask M may be primarily exposed to the first exposure source having the first energy. After the primary exposure of the photomask M in the first exposure chamber 540, the transfer arm R may transfer the photomask M to the outside of the first exposure chamber 540. The photomask M transferred to the outside of the first exposure chamber 540 may be transferred to the vacuum chamber 510 and may be then removed from the apparatus 500 for fabricating a photomask. Subsequently, the photomask M may be baked and developed, thereby forming a first resist pattern. Then, the photomask M may be etched to form a first light shielding pattern.

Next, the first resist pattern may be removed, and a second resist film may be formed on the first light shielding pattern. The photomask M having the second resist film formed thereon may be carried into the vacuum chamber 510, and the vacuum chamber 510 may be evacuated, i.e., placed under a vacuum. The transfer arm R may transfer the photomask M in the vacuum chamber 510 to the arranging chamber 530, may arrange the photomask M on the stage in the arranging chamber 530, and may transfer the arranged photomask M into the second exposure chamber 550. In the second exposure chamber 550, the second exposed regions of the photomask M may undergo a secondary exposure to the second exposure source having the second energy. After the secondary exposure of the photomask M, the transfer arm R may transfer the photomask M from the second exposure chamber 550 to the vacuum chamber 510. Then, the photomask M may be taken out from the apparatus 500 for fabricating a photomask. Subsequently, the photomask M may be baked and developed, thereby forming a second resist pattern. Then, the photomask M may be etched to form a second light shielding pattern. Next, the second resist pattern may be removed. In this way, the photomask M may be completed. The above-mentioned processes may correspond to the processes shown in FIGS. 4A to 4H.

A method of fabricating a photomask using an apparatus for fabricating a photomask according to another embodiment of the present invention will be described with reference to FIG. 7B. First, a light-shielding layer including an antireflection layer may be formed on a substrate, and a resist film may be formed on the light-shielding layer, thereby completing a blank photomask. The blank photomask may be carried into the vacuum chamber 510 of the apparatus for fabricating a photomask, and the vacuum chamber 510 may be evacuated, i.e., placed under a vacuum. Then, the chamber door D2 between the vacuum chamber 510 and the transfer chamber 520 may be opened. Subsequently, the transfer arm R may transfer the photomask M from the vacuum chamber 510 to the arranging chamber 530, may arrange the photomask M on the stage S in the arranging chamber 530, and may transfer the arranged photomask M to the first exposure chamber 540.

In the first exposure chamber 540, the first exposed regions of the photomask M may undergo a primary exposure to the first exposure source having the first energy. After the primary exposure of the photomask M in the first exposure chamber 540, the transfer arm R may transfer the photomask M to the second exposure chamber 550. In the second exposure chamber 550, the second exposed regions of the photomask M may undergo a secondary exposure to the second exposure source having the second energy. After the secondary exposure of the photomask M, the transfer arm R may transfer the photomask M from the second exposure chamber 550 to the vacuum chamber 510. Then, the photomask M may be taken out from the apparatus 500 for fabricating a photomask. Subsequently, the photomask M may be baked and developed, thereby forming a resist pattern. Then, the photomask M may be etched to form a light shielding pattern. Next, the resist pattern may be removed. In this way, the photomask M may be completed. The above-mentioned processes may be described with reference to FIGS. 5A to 5E.

The apparatus for fabricating a photomask according to an embodiment of the present invention may include a vacuum chamber, a transfer chamber including a transfer arm capable of loading or unloading photomasks, an arranging chamber for arranging the photomasks M, a first exposure chamber for exposing first regions of the surfaces of blank photomasks to an electron beam having a first acceleration voltage, and a second exposure chamber for exposing the second regions, which may be adjacent to and wider than the first regions, and the third regions, which may be separated from and wider than the first regions, of the surfaces of the photomasks to an electron beam having a second acceleration voltage that may be lower than the first acceleration voltage.

In addition, the present invention may be applied to a reflective photomask. The term "reflective photomask" refers to a photomask for forming a pattern on a wafer by reflecting light, for example, a photomask using EUV (Extreme Ultra Violet) light as an exposure source. The reflective photomask may be completed by laminating a reflective layer on a glass substrate made of quartz and forming a light shielding pattern on the reflective layer. Since the present invention may form a light shielding pattern, it may be applied to a reflective photomask. Although a method of fabricating a reflective photomask is not shown, those skilled in the art may easily apply the concepts of the present invention to a method of fabricating a reflective photomask. Therefore, the specification and claims of the present invention may include a reflective photomask as well as a transmissive photomask.

As described above, according to a photomask and a method and apparatus for fabricating a photomask of the above-described embodiments of the present invention, it may be possible to rapidly fabricate a photomask having a fine photomask pattern with the uniform line widths of separated patterns and close patterns.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a photomask, comprising:
   preparing a light-shielding layer and a first resist film on a substrate;
   forming a first resist pattern by exposing first exposed regions of the first resist film adjacent to patterns in a first pattern region to a first exposure source having a first energy, so as to selectively expose the light-shielding layer;
   forming a first light shielding pattern by etching the selectively exposed light-shielding layer by utilizing the first resist pattern as an etching mask;
   removing the first resist pattern;
   forming a second resist film on the first light-shielding layer;
   forming a second resist pattern by exposing second exposed regions of the second resist film, except for the first exposed regions of the first pattern region, and a second pattern region overlapping the first pattern region to a second exposure source having a second energy, the overlapping first and second pattern regions having different pattern densities;
   forming a second light shielding pattern by etching the selectively exposed first light shielding pattern by utilizing the second resist pattern as a mask for etching; and
   removing the second resist pattern.

2. The method as claimed in claim 1, wherein the pattern density of the first pattern region is lower than that of the second pattern region.

3. The method as claimed in claim 1, wherein:
   in the first pattern region, a gap between the patterns is equal to or more than about twice a line width of the pattern; and
   in the second pattern region, a gap between the patterns is equal to or less than about twice a line width of the pattern.

4. The method as claimed in claim 1, wherein the first exposure source is an electron beam, and the second exposure source is an electron beam or light.

5. The method as claimed in claim 1, wherein the first energy is higher than the second energy.

6. The method as claimed in claim 1, wherein the first energy has an acceleration voltage higher than that of the second energy.

7. The method as claimed in claim 1, wherein the first energy has an acceleration voltage of about 50 KeV, and the second energy has an acceleration voltage of about 10 KeV.

8. A method of fabricating a photomask, comprising:
   preparing a light-shielding layer and a resist film on a substrate;
   exposing first exposed regions of the resist film adjacent to patterns in a first pattern region to a first exposure source having a first energy;
   exposing second exposed regions of the resist film, except for the first exposed regions of the first pattern region, and a second pattern region overlapping the first pattern region to a second exposure source having a second energy, the overlapping first and second pattern regions having different pattern densities;
   forming a resist pattern by developing the resist film to selectively expose the light-shielding layer;
   forming a light shielding pattern by etching the selectively exposed light-shielding layer by utilizing the resist pattern as a mask for etching; and
   removing the resist pattern.

9. The method as claimed in claim 8, wherein the pattern density of the first pattern region is lower than that of the second pattern region.

10. The method as claimed in claim 8, wherein:
    in the first pattern region, a gap between the patterns is equal to or more than about twice a line width of the pattern; and
    in the second pattern region, a gap between the patterns is equal to or less than about twice a line width of the pattern.

11. The method as claimed in claim 8, wherein the first exposure source is an electron beam, and the second exposure source is an electron beam or light.

12. The method as claimed in claim 8, wherein the first energy is higher than the second energy.

13. The method as claimed in claim 8, wherein the first energy has an acceleration voltage higher than that of the second energy.

14. A photomask, fabricated by the photomask fabricating method according to claim 1.

15. A photomask, fabricated by the photomask fabricating method according to claim 8.

16. The method as claimed in claim 1, wherein:
    the second resist pattern is formed after removing the first resist pattern,
    the pattern density of the second pattern region exposed to form the second resist pattern is higher than that of the first pattern region, and
    the second light shielding pattern includes a low density region and a high density region based on the first and second pattern regions.

17. The method as claimed in claim 8, wherein:
    the pattern density of the second pattern region exposed to form the second resist pattern is higher than that of the first pattern region, and
    the light shielding pattern includes a low density region and a high density region based on the first and second pattern regions.

* * * * *